Dec. 25, 1962 TETSUO TSUKAMOTO 3,070,465

METHOD OF MANUFACTURING A GROWN TYPE SEMICONDUCTOR DEVICE

Filed May 8, 1958

INVENTOR.
Tetsuo Tsukamoto

BY

Attys

United States Patent Office 3,070,465

Patented Dec. 25, 1962

3,070,465

METHOD OF MANUFACTURING A GROWN TYPE SEMICONDUCTOR DEVICE

Tetsuo Tsukamoto, Tokyo, Japan, assignor to Sony Corporation, Tokyo, Japan, a corporation of Japan Filed May 8, 1958, Ser. No. 733,920
Claims priority, application Japan July 26, 1957
7 Claims. (Cl. 148—1.5)

This invention relates to a method of manufacturing a grown type semiconductor device, and more particularly to a method of making a n-p-n type semiconductor device.

In the case of double dope grown crystal, the base layer near the collector region is characterized with graded impurity distribution due to the delay time of mixing of base impurity into the melt.

It enhances the frequency response by the built-in drift field.

The high doped antimony and arsenic impurity in the emitter region may diffuse into the base region during the growth of the emitter region and then the compensated base impurity near the emitter region is decreased and build in retarding field of injected minority carriers.

Because of that retarding field, the alpha cutoff frequency becomes lower than expected value.

Due to the diffusion of antimony, also the emitter efficiency becomes low value and the total impurities in base region decrease, so *rb′* becomes higher.

Phosphorus has smaller diffusion coefficient than antimony.

When phosphorus is used as the emitter impurity, the diffusion of emitter impurity is decreased and so the retarding field effect is minimized.

It is an object of this invention to provide a method of manufacturing a semiconductor device which enables to obtain a semiconductor device having high emitter efficiency, short transit time and high cutoff frequency.

It is another object of this invention to provide a method of manufacturing a semiconductor device which has high production percentage of successful transistor having reduced average widths.

It is further object of this invention to provide a method of manufacturing a semiconductor device which produces grown type transistors having high electrical power gain in high frequency or radio frequency range of the order of 400 kc. per second or more and higher cutoff frequency of the order of 30 to 80 mc. per second in the greater part of the production.

It is still further object of this invention to provide a method of making a semiconductor device which can produce transistors having low base resistance and high current amplification factor in the greater part of the production percentage.

Other object, features and advantages of this invention will be more fully apparent from the following detailed description taken in connection with the accompanying drawings, in which.

Prior to entering into the description of this invention, I will explain a method of manufacturing a semiconductor device according to a double dope grown type process.

Figure 1:
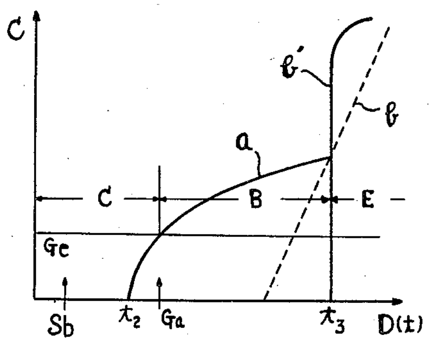
FIG. 1 shows curves for illustrating the method of manufacturing a semiconductor device according to this invention.

Referring to FIG. 1, the ordinate shows the concentration C of impurity to be doped and the abscissa the pull-up distance D or the pull-up time $t$.

In the art of an ordinary manufacturing method of a n-p-n type grown type semiconductor device, the method comprises doping antimony, Sb, or arsenic, As, into germanium, as the first dope, to form a collector region C (n-type) and adding gallium, Ga, to this region, as the second dope, at the time $t_2$ so that a base region B (p-type) is formed along the curve *a*, and making the third dope in which arsenic or antimony has been mainly used as the donor dope impurity. It will be seen in this case that arsenic or antimony enters into the base region B as shown by the dotted inclined curve *b* so that the base region apts to be shortcircuited. This is because of the fact that arsenic or antimony disperses into the base region from the emitter region E which has high impurity concentration during the crystal grown-up owing to large diffusion coefficient of arsenic or antimony. For this reason, a semiconductor device manufactured by the ordinary method above mentioned has the disadvantage that the inclination of the line *b* to the horizontal becomes sharp to reduce the base region, thereby causing the electrical short circuiting.

In accordance with this invention, an impurity having comparatively small diffusion coefficient is used as the emitter region so as to be able to control the base width as thin as possible. For this purpose, I use phosphorus which has one-severalth diffusion coefficient of arsenic or antimony instead thereof as the dope impurity. It is very difficult, however, to control the dope, since the amount of phosphorus is extremely small when it is used independently. According to this invention, a substance which can be added to phosphorus or alloyed therewith, the resultant being inserted to germanium, Ge, without giving any appreciable change in the electrical characteristic of the semiconductor device made therefrom, such for example as tin, Sn, indium, In, and the like, is used. That is, the alloy or alloys of phosphorus and tin etc., the mixture or mixtures thereof, mixed powder thereof or some organic substance into which phosphorus is covered can be doped during operation. It is recognized that a large amount of tin, Sn, in germanium, Ge, gives no change of the electrical characteristic of the semiconductor device when tin is doped into germanium. It is also apparent that the dope of indium changes some characteristic of the semiconductor device, but only a very small amount of indium enters into germanium owing to the small distribution constant of indium. In fact, the substances above described can be doped with phosphorus without substantially changing the electrical characteristic of the semiconductor device.

In phosphorus and tin alloys, it is preferable that the alloys are composed of 1% to 5% of phosphorus and 98% to 95% of tin. A large percentage of doping phosphorus enables to reduce the doping amount so that in this case there is no fear of temperature decrease during operation. Too small percentage of doping phosphorus, however, makes the operation unstable owing to the fact that too large doping amount is necessary.

For example, when phosphorus tin alloy having 5% of phosphorus is used, tin does not effect substantially to the electrical characteristic of germanium. Accordingly such an alloy can equally be treated as ordinary germanium alloys.

Indium-phosphorus compound which is wrapped by a tin foil can be also utilized.

Numerical examples of this invention are as follows: As the first dope (collector side), 70 milligrams of antimony-germanium alloy having 1% of antimony is doped into a crucible into which germanium charge amount of 65 grams is contained. A seed of germanium single crystal is dipped into the germanium in the crucible, the seed being rotating during dip operation and after five minutes the seed is began to be pulled up at the speed of ten microns per second. After three minutes, the temperature is decreased by 2° C. per minute. When the crystal is grown up to be a piece having diameter of 17 millimeters, the operating temperature is increased at the same rate as the temperature decrease up to 21° C. This temperature is maintained during the pull up speed of 0.5 micron per second. The second dope is done when the diameter of the crystal becomes 32 millimeters. In this process, gallium-germanium alloy having 1.4% of gallium of 5 milligrams is doped to form the base region. Next, after 5 seconds later, 100 milligrams of phosphorus-tin alloy having 5% of phosphorus is doped as the third dope (emitter side). At this time, it is preferable that the pull up speed is reduced very slowly and gallium and thereafter phosphorus alloy is added. However, prior to the second dope, the pull up speed is reduced to zero and gallium which will make the base region is added to the crystal glowing up according to the inclination of the germanium temperature and thereafter phosphorus or phosphorus-tin alloy which will form the emitter is added, thereby controlling the base width very thin.

By this process a transistor having 7 microns of base width in the periphery and 10 microns in the center thereof is obtained. Further, the width of the base can also be controlled to about 5 microns. The resulting crystal thus obtained has 40 grams in weight and resistivity of the collector is 1.5Ω cm. and resistivity of the emitter is 0.005Ω cm. Thus it is easy to control the base width at the range of 5 to 10 microns. A transistor thus obtained is highly adapted for high frequency use.

In accordance with this invention, by doping phosphorus, the emitter junction becomes acutely discontinuous as shown by the curve *b'* in FIG. 1 and the gradient of the impurity concentration does not run along a wrong way. Accordingly, a transistor made by the method of this invention has the advantages that it has high emitter efficiency, short transit time in which electrons pass through its base and also high cutoff frequency.

Figure 2:
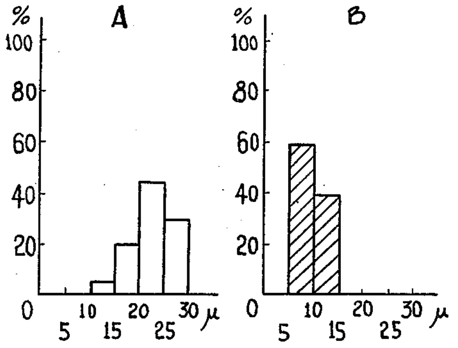
FIG. 2 shows graphs showing a relationship between the base width and production percentage of transistors made according to this invention as compared with an ordinary method.

Other advantages of this invention are as follows:

(1) In the ordinary method, the percentage of successful pull-up operation of the crystal is small as only 70% owing to almost rejected articles having short-circuited bases. According to this invention, on the contrary, the short-circuited base is scarcely recognized and successful articles of almost 90 to 100% can be obtained. Besides, the deviation of the characteristics of the transistor thus obtained is decreased. FIG. 2–A is a graph showing a relationship between the base width and its production percentage in transistors made by an ordinary method, while FIG. 2–B is a similar graph showing that in the transistors made by the method according to this invention. It will be seen from the comparison between the graphs that by the method according to this invention a large percentage of transistors having smaller average base width is obtained than with the ordinary method.

Figure 3:
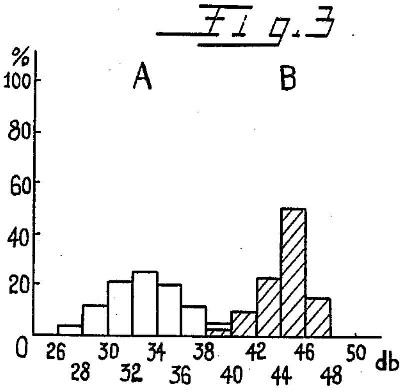
FIG. 3 shows the production percentage with respect to the electrical power gain characteristic of the transistors made by the method of this invention as compared with the ordinary method.

(2) FIG. 3 shows the production percentage with respect to the electrical power gain, at 455 kc./s., of transistors made by this invention as compared with the ordinary method, the graph A showing the percentage of the obtained transistors according to the ordinary method with gain distribution main part of which ranges from 30 to 38 db (33 db in the center), while the graph B showing, the percentage of the obtained transistors according to this invention with gain distribution ranging mainly from 40 to 47 db (44 db in the center) which shows epochal development of the characteristic of the transistors.

Figure 4:
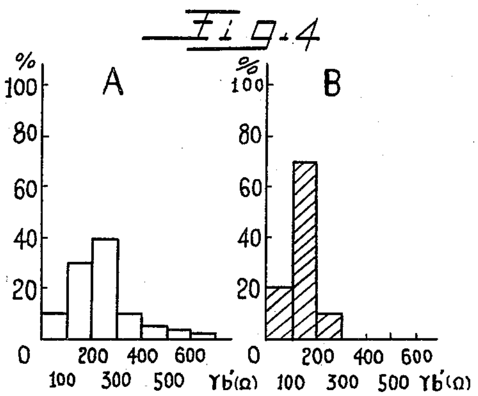
FIG. 4 shows graphs of the production percentage with respect to the base resistance of the transistors made by the method according to this invention as compared with the ordinary method.

(3) FIG. 4 shows graphs of the production percentage of the transistors with respect to the base resistance *rb'*, the curve A showing the production percentage of the transistors with wide range of base resistance according to the ordinary method, while the curve B showing the production percentage of the transistors with narrow range of base resistance according to the method according to this invention.

From these graphs, it will be seen that transistors having low base resistance and narrow range of the base resistance fluctuation can be obtained according to this invention.

Figure 5:
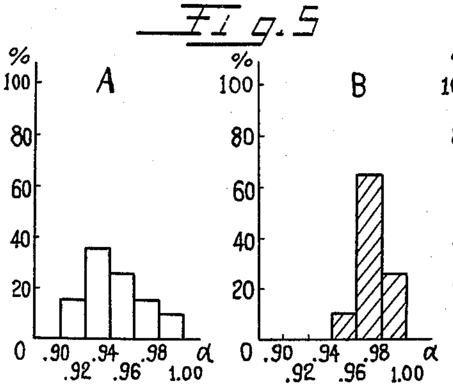
FIG. 5 shows graphs of the production percentage with respect to the current amplification of the transistor made by the method according to this invention as compared with the ordinary method.

(4) FIG. 5 shows graphs of the production percentage of the transistors with respect to the current multiplication $\alpha$, the curve A showing that in case of the ordinary method, while the curve B showing that in case of the method according to this invention.

From this comparison transistors according to this invention have greater current amplification of substantially the same magnitude.

Figure 6:
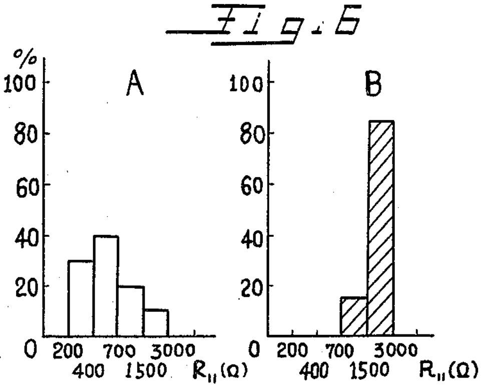
FIG. 6 shows graphs of the production percentage with respect to the input resistance of the transistors made by the method according to this invention as compared with the ordinary method.

(5) FIG. 6 shows graphs of the production percentage of the transistors with respect to the input resistance $R_{11}$, the curve A showing that in case of the ordinary method, while the curve B showing that in case of the method according to this invention. That is, it will be seen that the input resistance $R_{11}$ of the transistors obtained by the method according to this invention becomes higher in greater parts thereof.

(6) The cutoff frequency of transistors according to this invention is more than 30 to 80 mc., as compared with the order 3 to 10 mc. in transistors obtained by the ordinary method.

What is claimed is:

1. A single crystal growth, method of manufacturing a grown, single crystal, n-p-n transistor comprising the steps of:

melting a charge of germanium and a donor forming impurity, inserting and then slowly pulling a seed of germanium from said melt to grow a single crystal and to form a collector region, substantially discontinuing said pulling but continuing the growth mechanism of said crystal at a low rate, doping said melt with a gallium-germanium alloy to form a base region substantially during the low rate of crystal growth, and approximately five seconds after said base doping and substantially during the low rate of crystal growth doping said melt with an alloy consisting of from 1% to 5% of phosphorus as the active donor impurity for a phosphorus doped emitter region and from 95% to 99% of tin as a substantially neutral carrier to limit the width of said base region to a width not substantially greater than approximately 10 microns.

2. A single crystal, growth method of manufacturing a grown, single crystal, n-p-n type transistor comprising the steps of:

melting a charge of germanium doped with an antimony-germanium alloy, dipping a seed of germanium single crystal into said doped melt, slowly pulling said seed to grow a single crystal at a certain rate and to form a collector region therein, materially reducing the speed of said pulling to reduce the rate of crystal growth, substantially during said reduced rate of crystal growth, doping said melt with a gallium-germanium alloy, and shortly thereafter substantially during the reduced rate of crystal growth, doping said melt with an alloy of a small amount of phosphorus as the active donor impurity for a phosphorus doped emitter region with a major amount of indium as a substantially neutral carrier.

3. In a growth method of manufacturing a single crystal, germanium n-p-n type transistor wherein a single crystal is grown from a melt of doped germanium to form a collector region and said melt is subsequently successively doped during the crystal growth to form a base region and then an emitter region, the improvement comprising in combination therewith the forming of said base region and a base-emitter junction by suddenly changing the conductivity type of said melt by doping said melt during the crystal growth with an alloy comprising a major portion of a substantially neutral carrier chosen from the group consisting of tin and indium and a minor portion of phosphorus as the active donor impurity for said emitter region.

4. In the manufacture of an n-p-n type, germanium, grown single crystal transistor wherein a single crystal is grown from a melt of donor doped germanium to form a collector region by the slow pulling of said crystal from said melt and said melt is acceptor doped during the crystal growth to form a base region and then said melt is donor doped during the crystal growth to form an emitter region, the improvement comprising in combination therewith the forming of said base region and a base-emitter junction by suddenly changing the conductivity type of said melt by the donor doping of said melt during the crystal growth with an alloy comprising a major portion of a substantially neutral carrier chosen from the group consisting of tin and indium and a minor portion of phosphorus as the active donor impurity for said emitter region and by materially reducing the speed of said pulling prior to said acceptor doping for the base region to provide a lower rate of crystal growth substantially during said acceptor doping and substantially during at least said donor doping for the emitter region.

5. The growth type method of manufacturing a grown, single crystal, n-p-n type, germanium transistor comprising the steps of:

melting a charge of germanium doped with a donor impurity, dipping a seed of germanium single crystal into said doped melt, slowly pulling said seed and growing a single crystal from said melt to form a collector region, materially reducing the speed of said pulling to reduce the rate of crystal growth, substantially during the reduced rate of crystal growth, doping said melt with an acceptor type impurity and substantially during the reduced rate of crystal growth, doping said melt with an alloy of a small amount of phosphorus as the active donor impurity for a phosphorus doped emitter region with a major amount of a substantially neutral carrier chosen from the group comprising tin and indium.

6. The growth method of manufacturing a grown, single crystal, n-p-n type, germanium transistor comprising the steps of:

melting a charge of germanium with a donor type impurity chosen from the group consisting of antimony and arsenic, dipping a seed of germanium single crystal into said donor doped molten charge, slowly pulling said seed to grow a single crystal with a donor type collector region therein, substantially discontinuing said pulling by reducing the speed of said pulling to about zero to reduce the rate of crystal growth, doping said melt with an acceptor type impurity to form a collector-base junction and within a few seconds after said acceptor doping and substantially during the reduced rate of crystal growth, doping said melt with an alloy of a small minority part of phosphorus as the active and donor type impurity for the emitter region and a remaining majority part substantially of an inactive carrier impurity of the group consisting of tin and indium to form a base-emitter junction.

7. The growth method of manufacturing a grown, single crystal, n-p-n type, germanium transistor comprising the steps of:

melting a charge of germanium with a donor type impurity chosen from the group consisting of antimony and arsenic, dipping a seed of germanium into said donor doped molten charge, pulling said seed at a speed of about ten microns per second to grow a single crystal with a donor type collector region therein, substantially discontinuing said pulling by reducing the speed of said pulling to about one-half micron per second to reduce the rate of crystal growth, substantially during the reduced rate of crystal growth, doping said melt with a gallium-germanium alloy as an acceptor type impurity to form a collector-base junction and substantially during the reduced rate of crystal growth and within a time period of only a few seconds after said acceptor doping, doping said melt with an alloy of a small minority part of the order of 1% to 5% of phosphorus as the active and donor type impurity for the emitter region and a remaining majority part substantially of an inactive carrier impurity of the group consisting of tin and indium to form a base width of less than approximately 10 microns and a p-n and base-emitter junction.

References Cited in the file of this patent

UNITED STATES PATENTS

| | | |
|---|---|---|
| 2,686,212 | Horn et al. | Aug. 10, 1954 |
| 2,743,201 | Johnson et al. | Apr. 24, 1956 |
| 2,753,280 | Moore | July 3, 1956 |
| 2,762,730 | Alexander | Sept. 11, 1956 |
| 2,822,308 | Hall | Feb. 4, 1958 |
| 2,836,523 | Fuller | May 27, 1958 |
| 2,841,509 | Jensen et al. | July 1, 1958 |
| 2,852,420 | Pohl | Sept. 16, 1958 |
| 2,861,905 | Indig et al. | Nov. 25, 1958 |
| 2,892,739 | Rusler | June 30, 1959 |
| 2,899,343 | Statz | Aug. 11, 1959 |

FOREIGN PATENTS

| | | |
|---|---|---|
| 201,847 | Australia | Aug. 25, 1955 |
| 755,845 | Great Britain | Aug. 29, 1956 |
| 779,666 | Great Britain | July 24, 1957 |

OTHER REFERENCES

Billig: Proceedings of the Royal Society, A. vol. 229, pages 346–363 (1955).